(12) United States Patent
Bono et al.

(10) Patent No.: US 9,711,424 B2
(45) Date of Patent: Jul. 18, 2017

(54) LOW THERMAL STRESS PACKAGE FOR LARGE AREA SEMICONDUCTOR DIES

(71) Applicants: Richard J. Bono, Chicago, IL (US); Neil Solano, Chicago, IL (US)

(72) Inventors: Richard J. Bono, Chicago, IL (US); Neil Solano, Chicago, IL (US)

(73) Assignee: Littelfuse, Inc., Chicago, IL (US)

( * ) Notice: Subject to any disclaimer, the term of this patent is extended or adjusted under 35 U.S.C. 154(b) by 0 days.

(21) Appl. No.: 14/027,456

(22) Filed: Sep. 16, 2013

(65) Prior Publication Data

US 2014/0077378 A1    Mar. 20, 2014

Related U.S. Application Data

(60) Provisional application No. 61/701,798, filed on Sep. 17, 2012.

(51) Int. Cl.
| | |
|---|---|
| *H01L 23/13* | (2006.01) |
| *H01L 23/36* | (2006.01) |
| *H01L 25/065* | (2006.01) |
| *H01L 23/433* | (2006.01) |
| *H01L 23/495* | (2006.01) |

(52) U.S. Cl.
CPC ............ *H01L 23/13* (2013.01); *H01L 23/36* (2013.01); *H01L 23/4334* (2013.01); *H01L 23/49562* (2013.01); *H01L 23/49575* (2013.01); *H01L 25/0657* (2013.01); *H01L 2224/32014* (2013.01); *H01L 2224/32245* (2013.01); *H01L 2924/1301* (2013.01); *H01L 2924/181* (2013.01)

(58) Field of Classification Search
CPC ................... H01L 23/13; H01L 23/142; H01L 2224/32245; H01L 2224/32014
See application file for complete search history.

(56) References Cited

U.S. PATENT DOCUMENTS

| | | | |
|---|---|---|---|
| 5,263,245 A | 11/1993 | Patel et al. | |
| 5,483,741 A * | 1/1996 | Akram et al. | ................. 29/846 |
| 5,909,056 A | 6/1999 | Mertol | |
| 6,137,170 A | 10/2000 | Ujiie et al. | |
| 7,205,651 B2 | 4/2007 | Do et al. | |
| 2003/0003627 A1 * | 1/2003 | Yamaguchi et al. | .......... 438/123 |
| 2005/0133906 A1 | 6/2005 | Woodall et al. | |
| 2005/0156292 A1 * | 7/2005 | Paek | ............................. 257/666 |
| 2007/0222009 A1 * | 9/2007 | Kvisteroy | ..................... 257/415 |
| 2008/0079127 A1 * | 4/2008 | Gerber | ......................... 257/676 |
| 2010/0244214 A1 * | 9/2010 | Arita et al. | .................. 257/676 |

(Continued)

OTHER PUBLICATIONS

International Search Report and Written Opinion dated Feb. 25, 2014, from Corresponding international patent application No. PCT/US2013/060108 filed Sep. 17, 2013 (7 (seven) pages).

*Primary Examiner* — Daniel Luke

(57) ABSTRACT

A low thermal stress package for large area semiconductor dies. The package may include a substrate and at least one pedestal extending from the substrate, wherein the pedestal may have a mounting surface that is smaller than a mounting surface of a semiconductor die that is mounted to the pedestal. The bonded area between the die and the pedestal is therefore reduced relative to conventional semiconductor package substrates, as is the amount of thermal stress sustained by the die during thermal cycling.

16 Claims, 6 Drawing Sheets

(56) References Cited

U.S. PATENT DOCUMENTS

2010/0261313 A1* 10/2010 Toh ................... H01L 21/561
                                                              438/109
2012/0146192 A1*  6/2012 Han et al. ................. 257/618
2013/0207255 A1*  8/2013 Magnus et al. ........... 257/712

* cited by examiner

Temperature Cycle Test Results (-40°C to 125°C, 15mins Dwell Time)

FIG. 10

LOW THERMAL STRESS PACKAGE FOR LARGE AREA SEMICONDUCTOR DIES

CROSS-REFERENCE TO RELATED APPLICATION

This is a claims priority to U.S. Provisional Patent Application No. 61/701,798 filed Sep. 17, 2012.

FIELD OF THE DISCLOSURE

The disclosure relates generally to the field of semiconductor devices and more particularly to a low thermal stress package for large area semiconductor dies.

BACKGROUND OF THE DISCLOSURE

Packaging an integrated circuit is typically the final stage of semiconductor device fabrication. During packaging, a semiconductor die, which represents the core of a semiconductor device, is encased in a housing that protects the die against physical damage and corrosion. For example, semiconductor dies are commonly mounted on a copper substrate, using solder alloy reflow, conductive epoxy, and the like. The mounted semiconductor die is often then encapsulated within an epoxy compound.

As the power requirements of semiconductor devices have increased in recent years, larger semiconductor dies, sometimes referred to as "large area semiconductor dies," have become necessary for providing correspondingly greater levels of current handling. In some cases, such as in TVS diode applications, multiple large area dies must be connected in series in a stacked configuration to provide a sufficiently high breakdown voltage. A fundamental problem associated with packaging large area semiconductor dies is the effect of mismatches between the coefficient of thermal expansion (CTE) of the dies and the substrates upon which the dies are mounted. Such mismatches result in dies and their substrates expanding and contracting at different rates and to different degrees when exposed to thermal cycling conditions. As such, the dies are subjected to thermal stress. As will be appreciated, the semiconductor dies (e.g., silicon dies, or the like) are relatively brittle. Accordingly, they often crack or break as a result of such thermal stress, which causes device failure.

The amount of thermal stress is generally proportional to the amount of bonded surface area (i.e., the area of bonded, surface-to-surface contact) between a die and its substrate. Large area semiconductor dies, which share more bonded surface area with their substrates relative to smaller dies, are therefore more prone to cracking as a result of significant thermal stresses sustained during thermal cycling. For example, FIG. 1 shows a finite element analysis (FEA) of a stack 100 of three large area semiconductor dies 110 that are reflowed directly to a copper substrate 120. Approximately 100% of the surface area of the dies 110 is bonded to the substrate 120. It is apparent from this view that the dies 110 are placed under a significant amount of thermal stress.

In order to mitigate CTE mismatch problems, buffer layers formed of materials having CTEs similar to that of silicon are sometimes mounted between semiconductor dies and the substrates (e.g., copper). For example, in cases where electrical isolation is desired between a semiconductor die and a substrate, the buffer layer may be formed of a ceramic material such as alumina or AlNi. In cases where electrical isolation is not desired, the buffer layer may be formed of a conductive material such as molybdenum or tungsten alloy. Such materials are generally very expensive and are difficult to apply in conventional integrated circuit assembly operations.

In view of the forgoing, it would be desirable to provide a low cost, easily implemented package for large area semiconductor dies that does not subject dies to significant thermal stresses during thermal cycling.

SUMMARY

In accordance with the present disclosure, a low thermal stress package for large area semiconductor dies is provided. The package may include a substrate, such as may be formed of copper. At least one pedestal, such as may also be formed of copper, may extend from the substrate. The top of the pedestal may be smaller than the bottom of a die or die stack that is mounted on the pedestal. The bonded area between the die or die stack and the pedestal is therefore smaller than the bonded area of conventional package configurations. The amount of thermal stress imposed on the die or die stack is therefore reduced relative to conventional package configurations, as is the likelihood of die cracking as a result of such stress.

BRIEF DESCRIPTION OF THE DRAWINGS

By way of example, specific embodiments of the disclosed device will now be described, with reference to the accompanying drawings, in which:

FIG. 10 is a table presenting the results of an experimental performance comparison between a prior art semiconductor package and a semiconductor package in accordance with the present disclosure.

DETAILED DESCRIPTION

Figure 2A:
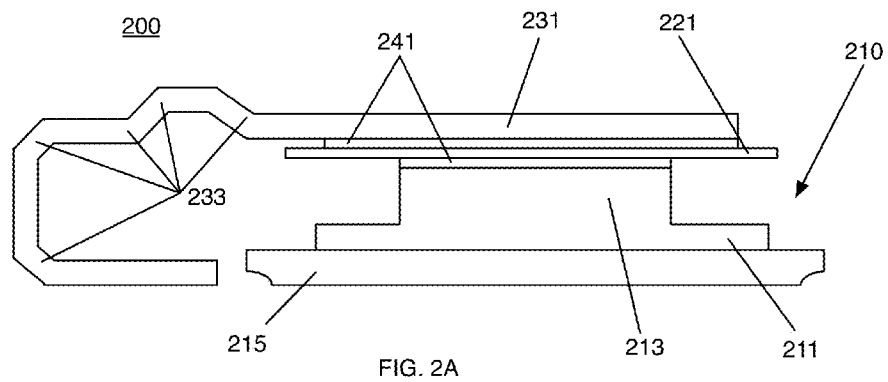
FIGS. 2A-2B are side and top views, respectively, illustrating a block diagram of a semiconductor device including a low thermal stress package in accordance with the present disclosure.

FIG. 2A illustrates a block diagram of a semiconductor device 200 including a low thermal stress package 210 (hereafter the "package"), arranged according to at least some embodiments of the present disclosure. As depicted, the semiconductor device 200 includes a die 221 mounted to the package 210. Those of ordinary skill in the art will appreciate what a die 221 is. As such, the exact nature of the die 221 is not addressed here. However, in some embodiments, the die 221 may be a large area die (e.g., a die having an area greater than 250 mil$^2$, larger than 6.35 mm$^2$, or the like. The die 221 may be mounted to the package 210 using material 241 (e.g., solder, conductive epoxy, or another suitable material.) For example, the die 221 can be mounted to the package 210 with solder using a solder reflow process. Furthermore, although not shown in FIG. 2, the semiconductor device 200 may be encapsulated in a plastic or epoxy (e.g., in order to protect the semiconductor device 200.)

Figure 1:
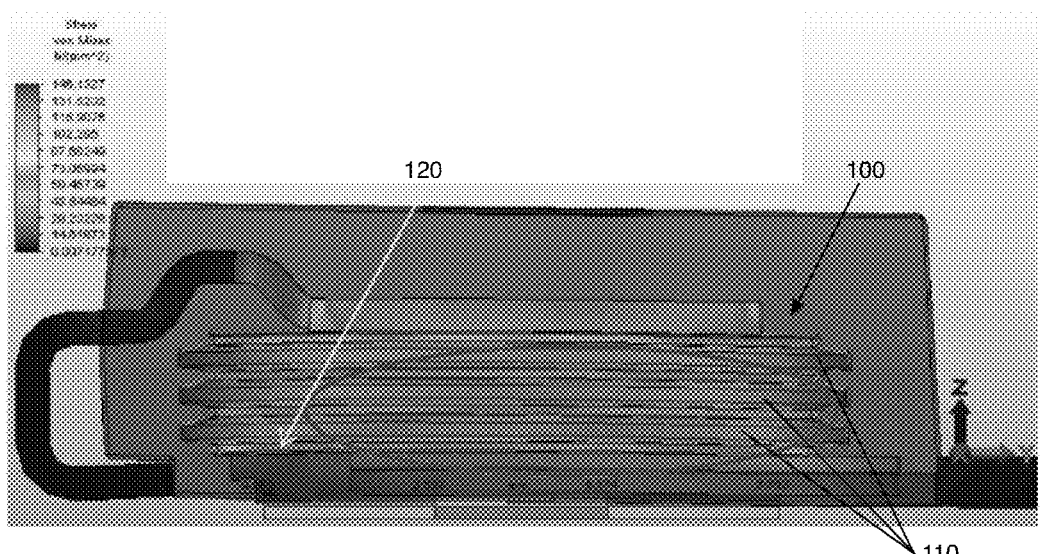
FIG. 1 is a side view illustrating a finite element analysis of a prior art semiconductor package.

The package 210 is configured to support the die 221. As depicted, the top of the package 210 has a surface area that is substantially smaller than the surface area of the bottom of the die 221. The bonded surface area between the die 221 and the package 510 is therefore significantly smaller than the bonded surface area of traditional packages (e.g., refer to FIG. 1) in which a die stack is bonded directly to the major surface of a substrate. The package configurations of the present disclosure, which will be more fully described below results in a significant reduction in the amount of thermal stress placed on the die 221 during thermal cycling, thus reducing the likelihood of die cracking.

A connector 231 is shown operably connected to the die 221. The connector 231 may be made of a conductive material (e.g., copper, copper alloy, silver, or the like) and configured to provide electrical connection between the die 221 and a circuit to which the semiconductor device 200 is to be connected. Although the connector 231 is shown having bends 233 facilitating a planar attachment of the connector 231, some examples may have a connector 231 with another configuration.

Figure 2B:
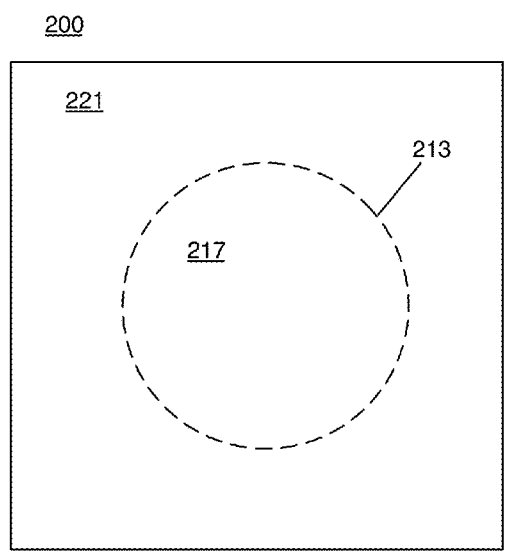

The package 210 includes a substrate 211, a pedestal 213, and a heat sink 215. As introduced above, the package 210 is configured to decrease the bonded area between the die 221 and the package 210. In some examples, the package 210 is configured to raise the die 221 above the substrate 211 and support the die 221 on the pedestal 213. The pedestal 213 is configured to have a mounting surface that is substantially smaller that than the mounting surface of the die 221. For example, FIG. 2B illustrates a top view of the semiconductor device 200, showing the die 221 and the pedestal 213. As depicted, the area (i.e., 251) of the mounting surface of the pedestal 213 is significantly smaller than the area (i.e., 253) of the die 221. Although the pedestal 213 is illustrated as having a generally circular shape, some embodiments may provide a square, rectangle, or other shaped pedestal. As such, the die 221 may not be as affected by thermal stress due to varying CFE's between the die 221 and the substrate 211. In some examples, the area of the mounting surface of the pedestal 213 is significantly less than the area of the mounting surface of the die 221 if it has 75% or less area. In some examples, the area of the mounting surface of the pedestal 213 is significantly less than the area of the mounting surface of the die 221 if it has 50% or less area. In some examples, the area of the mounting surface of the pedestal 213 is significantly less than the area of the mounting surface of the die 221 if it has 30% or less area. With some examples, the area of the die 221 may correspond to the area of metallization of the die 221. As indicated above, supporting the die 221 on the pedestal 213 provides for a reduction in the amount of thermal stress that affects the die 221. As such, the semiconductor device 200 may be more robust to mismatches between the CTE of the die 221, the substrate 211 and the pedestal 213.

In general, the substrate 211 and the pedestal 213 may be made from any material having desirable thermal and electrical conductive properties. In some examples, the substrate 211 and the pedestal 213 may be made from copper, nickel-iron alloy, or another suitable conductive material. In some embodiments, the substrate 211 and the pedestal 213 may be made from a single piece of material. For example, a copper blank may be coined to form the pedestal portions 213 and the substrate portions 211. As another example, a copper blank may be chemically and/or mechanically etched to form the pedestal portions 213 and the substrate 211.

Figure 3:
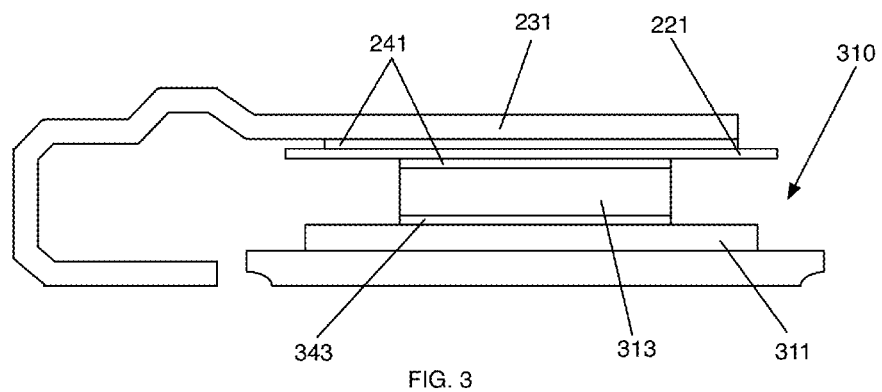
FIGS. 3-4 are side views illustrating semiconductor devices including low thermal stress packages in accordance with the present disclosure.

In other examples, the substrate 211 and the pedestal 213 may be joined during assembly. FIG. 3 illustrates a semiconductor device 300, including a package 310, the die 221, and the connector 231. The package 310, is shown having a substrate 311 and a pedestal 313 formed from separate pieces of material and attached with material 343, which may be solder, epoxy, or another material. In some examples, substrate 311 and pedestal 313 may be formed from material blanks (e.g., stamped, cut, or the like) and then joined during assembly of the semiconductor device 300 (e.g., using a solder reflow process, or the like) to form the package 310.

Figure 4:
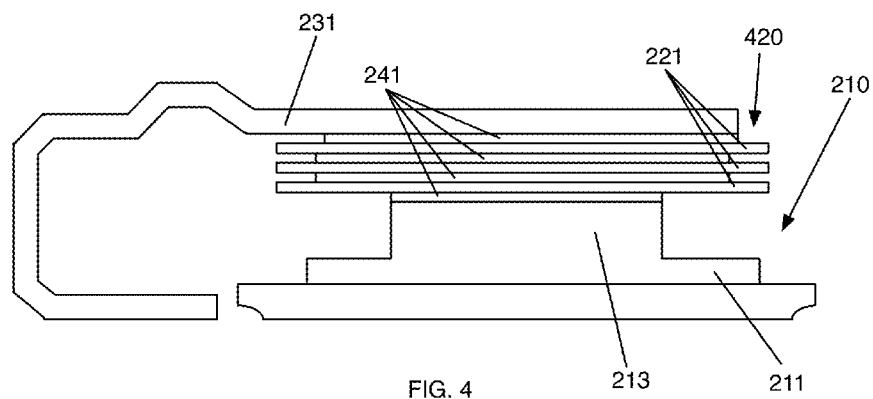

In some examples, the semiconductor device may include multiple dies (e.g., connected in a stack, or the like.) FIG. 4 illustrates a block diagram of a semiconductor device 400 include a die stack 420 having multiple semiconductor dies 221 connected together (e.g., typically in serial) to form a semiconductor device with desired characteristics. As will be appreciated, the semiconductor dies 221 may be connected in various configurations to form different types (e.g., Thyristor, TVS diode, PNP device, NPN device, or the like) of semiconductor devices. The die stack 420 is shown supported on the package 210 including the substrate 211 and the pedestal 213. The connector 231 is also shown, configured to provide electrical connection to the die stack 420. The components of the semiconductor device 400 are shown connected with material 241 (e.g., solder, or the like.)

Accordingly, semiconductor devices that are more robust to mismatches between CTE of materials are provided. The above embodiments illustrate that various costly CTE matching materials (e.g., Mo alloy, W alloy, etc.) may be eliminated from the semiconductor device without adverse effect to the amount of thermal stress for which the device is subjected. The semiconductor device of the present disclosure may be produced for reduced cost using standard assembly techniques. Furthermore, the devices according to the present disclosure may provide increased current handling and thermal dissipation characteristics versus conventional devices. These advantageous are illustrated and described with reference to FIGS. 5-9, which illustrate finite element analysis (FAE) of various semiconductor devices according to embodiments of the present disclosure.

Figure 5:
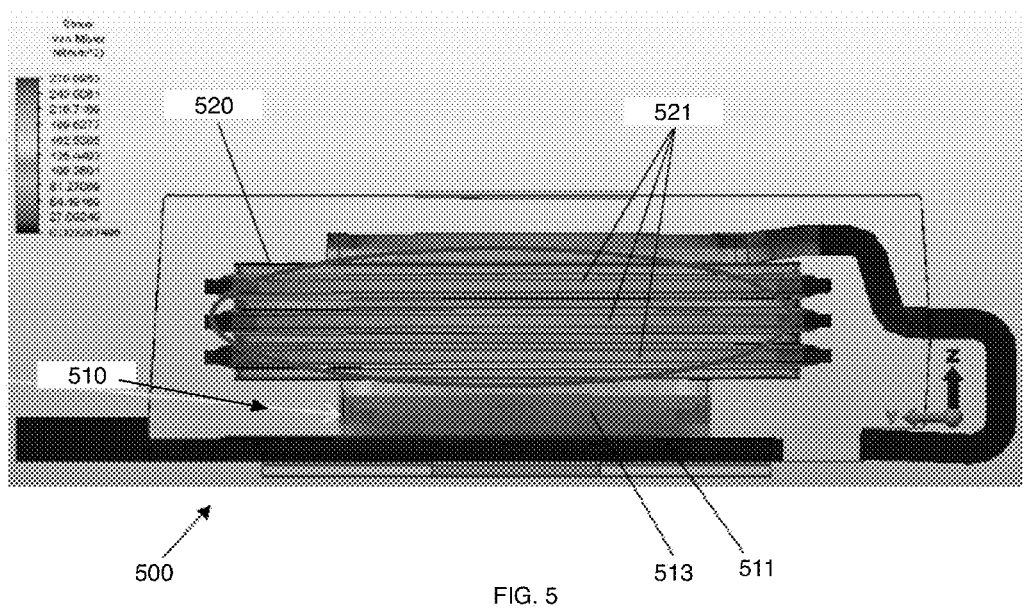
FIG. 5 is a side view illustrating a finite element analysis of a semiconductor device including a low thermal stress package in accordance with the present disclosure.

Referring to FIG. 5, an FEA of a semiconductor device 500 including a package 510. The package 510 includes a substrate 511 and a pedestal 513, which is supporting a die stack 520 including semiconductor dies 521. As depicted, the top of the pedestal 513 has a surface area that is substantially smaller than the surface area of the bottom of the die stack 520. The bonded surface area between the die stack 520 and the pedestal 513 is therefore significantly smaller than the bonded surface area of traditional packages (e.g., refer to FIG. 1) in which a die stack is bonded directly to the major surface of a substrate. This pedestal-mounted configuration results in a significant reduction in the amount of thermal stress placed on the die stack 520 during thermal cycling, thus reducing the likelihood of die cracking.

Figure 6:
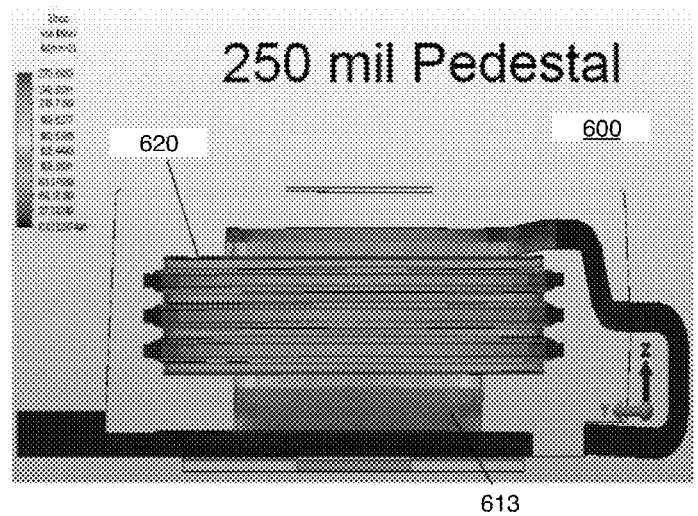
FIG. 6 is a side view illustrating a finite element analysis of a semiconductor package in accordance with the present disclosure with a 250 mil pedestal.

Referring to FIGS. 6-9, several FEA analyses of substrate pedestals similar to the pedestals described above are presented to more clearly illustrate the fundamental benefits of the present disclosure. In general, these figures depict FEA analyses for various embodiments of the present disclosure where the bonded area between a die stack and the substrate is reduced from between 90%-100% (as is typical with conventional processes) to approximately 50%-75% (as is obtained by the present disclosure.) Turning now to FIG. 6, an example pedestal 613 having a relatively narrow width of 250 mil is shown. The pedestal 613 is depicted supporting a die stack 620. As can be seen, the thermal stress sustained by the die stack 620 is minimal.

Figure 7:
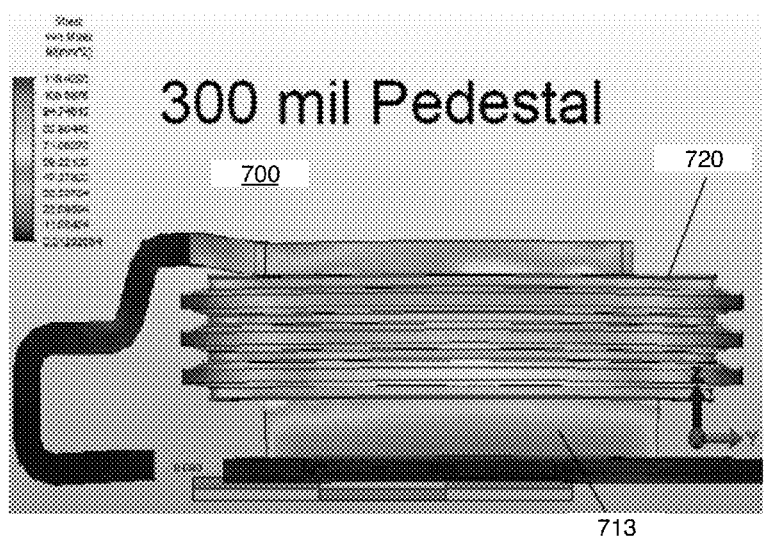
FIG. 7 is a side view illustrating a finite element analysis of a semiconductor package in accordance with the present disclosure with a 300 mil pedestal.
Figure 8:
FIG. 8 is a side view illustrating a finite element analysis of a semiconductor package in accordance with the present disclosure with a 350 mil pedestal.
Figure 9:
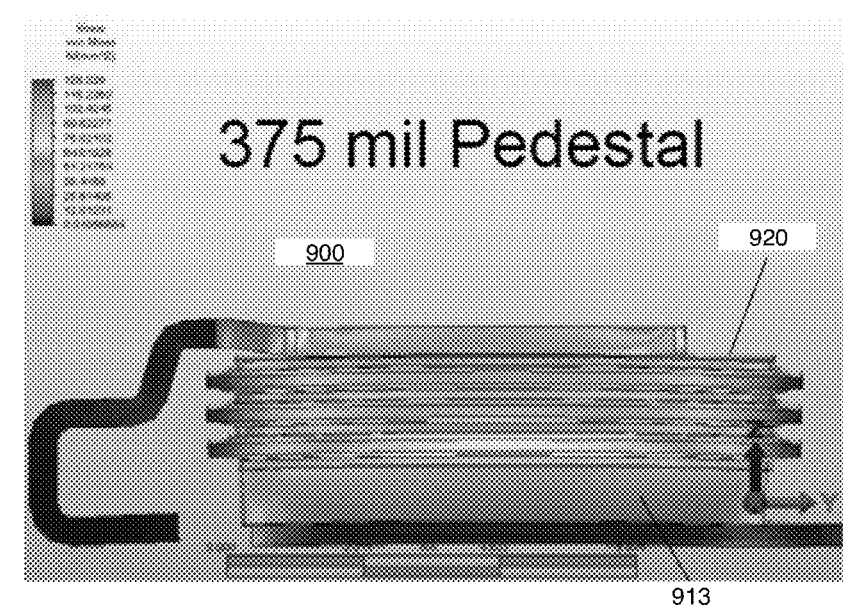
FIG. 9 is a side view illustrating a finite element analysis of a semiconductor package in accordance with the present disclosure with a 375 mil pedestal.

Referring now to FIG. 7, an example pedestal 713 having a width of 300 mil, which is supporting a die stack 720, is shown. As can be seen, the thermal stress sustained by the die stack 720, which is substantially identical to the die stack 620 of FIG. 6, is significantly greater than the stress imparted by the pedestal 613 (e.g., the 250 mil pedestal.) Referring now to FIG. 8, an even larger example pedestal 813 having a width of 350 mil and supporting a die stack 820 is shown. As can be seen, the thermal stress sustained of the die stack 820, which is substantially identical to the die stack 720 of FIG. 7, is somewhat greater than the stress imparted by the pedestal 713 (e.g., 300 mil pedestal.) Referring now to FIG. 9, a still larger example pedestal 913 having a width of 375 mil supporting a die stack 920 is shown. As depicted, the width of the pedestal 913 is substantially equal to the width of the lower surface of the die stack 920. As can be seen, the thermal stress sustained by the die stack 920, which is substantially identical to the die stack 820 of FIG. 8, is slightly greater than the stress imparted by the pedestal 813 (e.g., the 350 mil pedestal.)

In view of the forgoing, it is evident that providing a substrate pedestal having a top surface that is substantially smaller than the bottom surface of a die or die stack mounted upon it provides a significant reduction in thermal stress relative to conventional package substrates. This is further illustrated by the table in FIG. 10, which presents the results of an experiment in which semiconductor dies were mounted on a conventional package substrate and a package substrate featuring pedestals in accordance with the present disclosure. In the experiment, each pedestal had approximate dimensions of 200 mil×200 mil×39 mil. The dies used in this experiment had an approximate area of 410 mil$^2$. The semiconductor dies and pedestals were subjected to a plurality of thermal cycles between −40 degrees C. and 125 degrees C. The conventional substrate produced ten failures (i.e., cracked semiconductor dies) after 100 thermal cycles. Seven of the failures occurred after only seven cycles. By contrast, the substrate in accordance with the present disclosure produced zero failures after 100 thermal cycles.

Semiconductor die packages according to the present disclosure (e.g., wherein the bonded surface between the die and the substrate is significantly smaller than the metallization area of the die) thus provides a low cost means for mitigating thermal stress sustained by semiconductor die during thermal cycling. Moreover, packages of the present disclosure provides better current handling relative to conventional thermal stress buffer layers formed of molybdenum or tungsten alloy. Still further, packages of the present disclosure may be implemented using standard assembly and solder reflow techniques.

The invention claimed is:

1. A low thermal stress package for semiconductor dies comprising:
   a substrate;
   a single pedestal extending from the substrate to support a semiconductor die away from the substrate and form a gap between the substrate and an overhanging portion of the semiconductor die to allow for thermal expansion and contraction of the semiconductor die, the single pedestal having a mounting surface that is at least 50% smaller than a mounting surface of the semiconductor die to be mounted to the single pedestal;
   a heat sink coupled to the substrate, the heat sink extending beyond the mounting surface of the single pedestal and beyond the mounting surface of the semiconductor die; and
   a layer of solder, the layer of solder attaching the substrate to the single pedestal.

2. The low thermal stress package for semiconductor dies according to claim 1, wherein the pedestal is comprised of copper.

3. The low thermal stress package for semiconductor dies according to claim 1, wherein the pedestal is formed using at least one of the following: coining, stamping, or etching.

4. The low thermal stress package for semiconductor dies according to claim 1, wherein the area of the mounting surface of the pedestal is 50% or less than the area of the mounting surface of the semiconductor die.

5. The low thermal stress package for semiconductor dies according to claim 1, wherein the pedestal is soldered to the substrate using a reflow soldering process.

6. The low thermal stress package for semiconductor dies according to claim 1, wherein the pedestal has a height of approximately 39 mil.

7. The low thermal stress package for semiconductor dies according to claim 1, wherein the pedestal has a first width and length of approximately 200 mil.

8. A semiconductor device comprising:
   a low thermal stress package having a single pedestal portion, a substrate portion, and a heat sink;
   a semiconductor die mounted on the pedestal portion of the low thermal stress package;
   a layer of solder attaching the single pedestal portion to the substrate,
   wherein the semiconductor die has an area greater than 6.35 mm$^2$,
   wherein the single pedestal portion supports the semiconductor die away from the substrate portion and forms a gap between the substrate portion and an overhanging portion of the semiconductor die,
   wherein the single pedestal portion has a mounting surface that is at least 50% smaller than a mounting surface of the semiconductor die, and
   wherein the heat sink extends beyond the overhanging portion of the semiconductor die.

9. The semiconductor device according to claim 8, wherein the single pedestal portion is disposed between the substrate portion and the semiconductor die.

10. The semiconductor device according to claim 8, wherein the substrate portion and the single pedestal portion are formed using at least one of the following: coining, stamping, or etching.

11. The semiconductor device according to claim 8, wherein the single pedestal portion is comprised of copper.

12. The semiconductor device according to claim 8, wherein the single pedestal portion is soldered to the substrate portion using a reflow soldering process.

13. The semiconductor device according to claim 8, wherein the area of the mounting surface of the single pedestal portion is 50% or less than the area of the mounting surface of the semiconductor die.

14. The semiconductor device according to claim 8, wherein the single pedestal portion has a height of approximately 39 mil.

15. The semiconductor device according to claim 8, wherein the pedestal portion has a first width and length of approximately 200 mil.

16. A method of minimizing thermal stress of a semiconductor device comprising:
- mounting a semiconductor die having an area greater than 6.35 mm² to a single pedestal portion of a low thermal stress package such that the single pedestal portion supports the semiconductor die away from a substrate portion and forms a gap between the substrate portion and an overhanging portion of the semiconductor die to allow for thermal expansion and contraction of the semiconductor die;
- attaching the substrate portion to the single pedestal portion;
- coupling a heat sink to the substrate portion, the heat sink extending beyond the overhanging portion of the semiconductor die,
- wherein a bonded area between the semiconductor die and the single pedestal portion is at least 50% less than a metallization area of the semiconductor die.

* * * * *